United States Patent
Wang et al.

(10) Patent No.: US 12,034,293 B2
(45) Date of Patent: Jul. 9, 2024

(54) SMART WINDOW AND CONTROLLER THEREOF, POWER DETECTION METHOD AND STORAGE MEDIUM

(71) Applicants: Beijing BOE Sensor Technology Co., Ltd., Beijing (CN); BOE Technology Group Co., Ltd., Beijing (CN)

(72) Inventors: Yongbo Wang, Beijing (CN); Chen Meng, Beijing (CN); Dahai Hu, Beijing (CN); Siheng Xu, Beijing (CN); Wenjie Zhong, Beijing (CN); Binbin Liu, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 451 days.

(21) Appl. No.: 17/274,855

(22) PCT Filed: Jun. 5, 2020

(86) PCT No.: PCT/CN2020/094640
§ 371 (c)(1),
(2) Date: Mar. 10, 2021

(87) PCT Pub. No.: WO2021/243697
PCT Pub. Date: Dec. 9, 2021

(65) Prior Publication Data
US 2022/0200270 A1 Jun. 23, 2022

(51) Int. Cl.
*H02H 7/20* (2006.01)
*G01R 21/06* (2006.01)
*H02H 1/00* (2006.01)

(52) U.S. Cl.
CPC .............. *H02H 7/20* (2013.01); *G01R 21/06* (2013.01); *H02H 1/0007* (2013.01)

(58) Field of Classification Search
CPC ...... G01R 21/06; G01R 21/07; G01R 21/001; H02H 1/0007; H02H 7/20; H02H 7/205
See application file for complete search history.

(56) References Cited

U.S. PATENT DOCUMENTS 5,457,364 A * 10/1995 Bilotti .................. H02H 7/0855
                                                         318/434
11,171,481 B1 * 11/2021 Hudson ................ B60R 16/033
(Continued)

FOREIGN PATENT DOCUMENTS

CN    2905993 Y    5/2007
CN    2931719 Y    8/2007
(Continued)

OTHER PUBLICATIONS

First Office Action dated Dec. 1, 2022 corresponding to Chinese Office Action No. 202080000922.6.

*Primary Examiner* — Nguyen Tran
(74) *Attorney, Agent, or Firm* — Nath, Goldberg & Meyer; Joshua B. Goldberg

(57) ABSTRACT

A smart window and a controller thereof, a power detection method and a non-transitory computer-readable storage medium are provided. The controller includes: a microcontroller; an output circuit coupled to the microcontroller and configured to output a driving signal under a control of the microcontroller; a first power supply coupled to a load through the output circuit and configured to supply an operating power supply to the load; a sampling resistor between the output circuit and the first power supply, a first terminal of the sampling resistor being coupled to the first power supply, and the second terminal of the sampling resistor being coupled to the output circuit; and a power acquiring circuit coupled to the microcontroller and coupled to the first terminal and the second terminal of the sampling resistor, respectively.

18 Claims, 4 Drawing Sheets

(56) References Cited

U.S. PATENT DOCUMENTS

| | | | | |
|---|---|---|---|---|
| 11,717,481 B2* | 8/2023 | Ryde | ............... | A61K 47/32 |
| | | | | 424/489 |
| 2018/0358915 A1* | 12/2018 | Ishizuka | ............. | H02M 3/1584 |
| 2022/0181879 A1* | 6/2022 | Kataoka | ................... | H02J 1/14 |

FOREIGN PATENT DOCUMENTS

| | | |
|---|---|---|
| CN | 201945832 U | 8/2011 |
| CN | 102287113 A | 12/2011 |
| CN | 202483338 U | 10/2012 |
| CN | 202899882 U | 4/2013 |
| CN | 105971436 A | 9/2016 |
| CN | 207304418 U | 5/2018 |
| CN | 209838066 U | 12/2019 |
| JP | H08251982 A | 9/1996 |
| JP | 2008017611 A | 1/2008 |

\* cited by examiner

SMART WINDOW AND CONTROLLER THEREOF, POWER DETECTION METHOD AND STORAGE MEDIUM

This is a National Phase Application filed under 35 U.S.C. 371 as a national stage of PCT/CN2020/094640, filed Jun. 5, 2020, the content of which is hereby incorporated by reference in its entirety.

TECHNICAL FIELD

The present disclosure relates to the technical field of a smart window, and particularly relates to a smart window and a controller thereof, and a power detection method and a storage medium.

BACKGROUND

In the process of controlling a smart window by a window controller (an intelligent window controller or a wisdom window controller), output-shorting of a system in a power-on state may occur due to an error operation, or due to preparation of liquid crystal molecules in the smart window or other external factors, which causes an abnormal conduction of a transistor in an output circuit of the controller and a device to be burnt, resulting in a fault or an abnormal control.

In order to solve the above problems, a current limiting control may be performed with a current limiting resistor or a BUCK circuit.

SUMMARY

According to one aspect of the present disclosure, a smart window controller is provided. The smart window controller includes: a microcontroller; an output circuit coupled to the microcontroller and configured to output a driving signal under a control of the microcontroller; a first power supply coupled to a load through the output circuit and configured to supply an operating power supply to the load; a sampling resistor between the output circuit and the first power supply, a first terminal of the sampling resistor being coupled to the first power supply, and the second terminal of the sampling resistor being coupled to the output circuit; and a power acquiring circuit coupled to the microcontroller and respectively coupled to the first terminal and the second terminal of the sampling resistor, so as to acquire a voltage across two terminals of the sampling resistor and send the voltage to the microcontroller based on a power detection instruction sent by the microcontroller, and further to acquire a load current value and a load power value.

In some embodiments, the power acquiring circuit includes: a channel interface coupled to the first terminal and the second terminal of the sampling resistor respectively; and a sampling path coupled to the channel interface and the microcontroller to transfer a sampling signal of the sampling resistor to the microcontroller.

In some embodiments, the channel interface includes: a first interface coupled to a first terminal of the sampling resistor and configured to receive a first sampling signal; a second interface coupled to a second terminal of the sampling resistor and configured to receive a second sampling signal; and a multiplexer coupled to the first interface and the second interface, and configured to select to transfer the first sampling signal or the second sampling signal to the sampling path based on the power detection instruction.

In some embodiments, the power acquiring circuit further includes a channel selector, wherein the channel selector is coupled to the multiplexer and the microcontroller, and is configured to generate a multiplex selection signal according to the power detection instruction to control whether the first interface is coupled to the sampling path or the second interface is coupled to the sampling path.

In some embodiments, the sampling path includes: an amplifier coupled to the multiplexer and configured to amplify the received first sampling signal and the received second sampling signal; a signal adjustment circuit coupled to the amplifier and configured to adjust the amplified first sampling signal and the amplified second sampling signal to a desired level; and an analog-to-digital conversion circuit coupled to the signal adjustment circuit and configured to convert the analog first sampling signal and the analog second sampling signals into digital signals.

In some embodiments, the sampling path further comprises a protocol conversion circuit coupled to the analog-to-digital conversion circuit, the channel selector, and the microcontroller, to perform protocol conversion on communication data between the analog-to-digital conversion circuit and the microcontroller and communication data between the channel selector and the microcontroller.

In some embodiments, the smart window controller further includes a filter circuit coupled to the first terminal and the second terminal of the sampling resistor, the first interface and the second interface, respectively, to filter the first sampling signal and the second sampling signal and output the filtered first sampling signal and the filtered second sampling signal to the first interface and the second interface respectively.

In some embodiments, the microcontroller is configured to: generate automatically the power detection instruction and send the power detection instruction to the power acquiring circuit; calculate the load power value according to the first sampling signal and the second sampling signal respectively; compare the load power value with a preset power value; and determine whether a load circuit has a fault or not according to the comparison result of the load power value and the preset power value.

In some embodiments, the smart window controller further includes a data memory coupled to the microcontroller to store the first sampling signal, the second sampling signal, the preset power value, a load voltage value, the load current value, and the load power value.

In some embodiments, the output circuit is an H-bridge output circuit, and the smart window controller further comprises a voltage conversion circuit coupled between the first power supply and the first terminal of the sampling resistor.

In some embodiments, the H-bridge output circuit includes a first transistor, a second transistor, a third transistor, and a fourth transistor, and a gate of the first transistor is coupled to the microcontroller, a first electrode of the first transistor is coupled to the second terminal of the sampling resistor, and a second electrode of the first transistor is coupled to a first voltage output terminal; a gate of the second transistor is coupled to the microcontroller, a first electrode of the second transistor is coupled to the second terminal of the sampling resistor, and a second electrode of the second transistor is coupled to a second voltage output terminal; a gate of the third transistor is coupled to the microcontroller, a first electrode of the third transistor is coupled to the first voltage terminal, and a second electrode of the third transistor is coupled to the first voltage output terminal; and a gate of the fourth transistor is coupled to the microcontroller, a first electrode of the fourth transistor is coupled to the first voltage terminal, and a second electrode of the fourth transistor is coupled to the second voltage output terminal.

In some embodiments, the output circuit is an operational amplifier circuit, and the smart window controller further comprises a voltage conversion circuit and a digital-to-analog conversion circuit or comprises a voltage conversion circuit and a signal generation circuit, the voltage conversion circuit is between the second terminal of the sampling resistor and the operational amplifier circuit, the digital-to-analog conversion circuit or the signal generation circuit is between the output circuit and the microcontroller.

According to another aspect of the present disclosure, a smart window including the smart window controller above and a load circuit is provided.

According to another aspect of the present disclosure, a method for detecting a power by using the smart window controller above is provided. The method includes: sending automatically, by a microcontroller, a power detection instruction to a power acquiring circuit; sampling, by the power acquiring circuit, a voltage across two terminals of a sampling resistor coupled to a first power supply and a output circuit according to the power detection instruction; sending, by the power acquiring circuit, a sampling signal to the microcontroller; and detecting, by the microcontroller, a load power according to the sampling signal.

In some embodiments, sampling the voltage across the two terminal of the sampling resistor further includes: sampling a voltage at the first terminal of the sampling resistor coupled to the first power supply to obtain a first sampling signal; and sampling a voltage at the second terminal of the sampling resistor coupled to the output circuit to obtain a second sampling signal.

In some embodiments, the detecting, by the microcontroller, the load power according to the sampling signal further includes: calculating a load power value according to the first sampling signal and the second sampling signal; comparing the load power value to a preset power value; and determining whether the load has a fault or not according to the comparison result of the load power value and the preset power value, and if the load power value is not in a range of the preset power value, determining that the load has a fault, cutting off an output current or an output voltage and raising an alarm.

According to one aspect of the present disclosure, a storage medium having a computer program stored thereon is provided. When executed by a processor, the computer program implementing the method above.

DETAILED DESCRIPTION

In order to make one of ordinary skill in the art better understand the technical solutions of the present disclosure, the following detailed description is given with reference to the accompanying drawings and the embodiments.

In the related art, a current limiting control in an output circuit may be implemented by adding a current limiting resistor or by a BUCK circuit in order to solve the problems, such as a fault or an abnormal control caused by an abnormal conduction of a transistor in the output circuit and device burnt due to various factors. However, the added current limiting resistor may result in a decrease in an output power and deterioration in control flexibility; and a setting of a current limiting threshold and an accurate control of the current limiting cannot be implemented flexibly in the BUCK circuit.

Therefore, a smart window controller is provided in the present disclosure. A power detection circuit is provided in the smart window controller, and may detect a magnitude of an output current in real time, thereby solving the problems, e.g., in the prior art, the magnitude of the output current cannot be detected, or devices at an output side cannot be protected when the output circuit is shorted.

Figure 1:
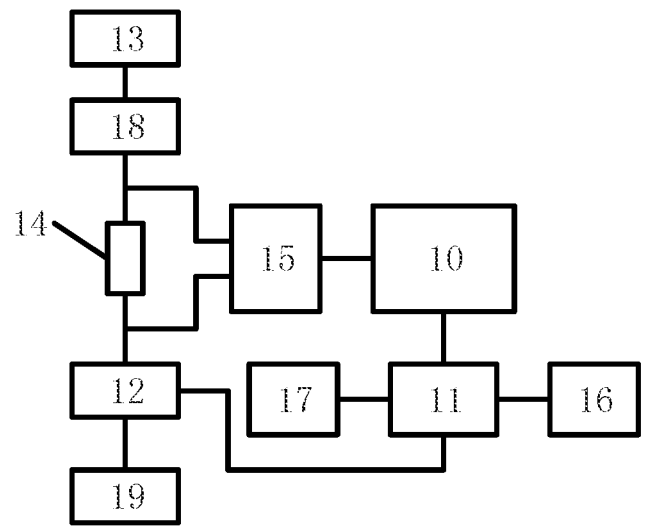
FIG. 1 is a schematic circuit diagram of a smart window controller according to an embodiment of the present disclosure.

FIG. 1 is a schematic circuit diagram of a smart window controller according to an embodiment of the present disclosure. As shown in FIG. 1, the smart window controller includes: a microcontroller 11; an output circuit 12 which is coupled to the microcontroller 11 and is used for outputting a driving signal to the smart window as a load, under a control of the microcontroller 11; a first power supply 13 coupled to the smart window through the output circuit 12, the first power supply 13 being a system power supply for supplying operating power supply to the smart window; a sampling resistor 14 between the output circuit 12 and the first power supply 13, a first terminal of the sampling resistor 14 being coupled to the first power supply 13 and a second terminal of the sampling resistor 14 being coupled to the output circuit 12; and a power acquiring circuit 10 coupled to the microcontroller 11 and the system power supply 13, and respectively coupled to the first terminal and the second terminal of the sampling resistor 14 (i.e., coupled to the sampling resistor 14 in parallel). The power acquiring circuit 10 acquires a voltage across the two terminals of the sampling resistor 14 and sends the voltage to the microcontroller 11 according to a power detection instruction sent by the microcontroller 11, to obtain a current and a power of the smart window.

In the present disclosure, the first power supply 13 as a power supply inlet is located at a most front side along a signal flow in the smart window controller, and the power supply inlet is reserved for measuring a total power consumption of a system. A sampling circuit at the sampling resistor 14 obtains the voltage across the two terminals of the sampling resistor 14. The microcontroller 11 calculates the current of the smart window based on the voltage across the two terminals of the sampling resistor 14. Due to quick sampling and interference noise at the sampling resistor 14 caused by the power supply, a RC filter circuit 15 is provided at a position where the sampling resistor 14 is coupled to the power acquiring circuit, so as to perform a low pass filtering on the sampled voltage to filter out power frequency noise and power ripple.

By providing the power acquiring circuit 10 for the smart window controller, the power acquiring circuit 10 acquires the voltage across the two terminals of the sampling resistor 14 and sends the voltage to the microcontroller under a control of the power detection instruction from the microcontroller 10, so as to obtain the current and the power of the smart window. When the current and the power of the smart window are detected to be abnormal, the microcontroller 11 may send a control instruction to cut off the output current or the output voltage and raise an alarm, such that the problems, e.g., the smart window controller cannot detect the magnitude of the output current or the devices at the output side cannot be protected when the output circuit is shorted, are solved.

Figure 2:
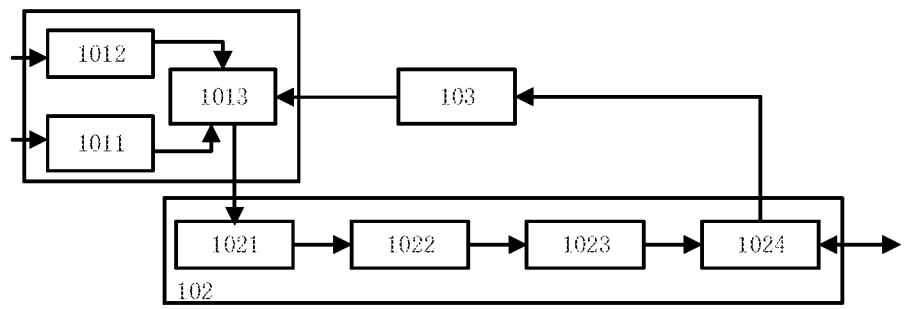
FIG. 2 is a schematic circuit diagram of a power acquiring circuit according to an embodiment of the present disclosure.

In some embodiments, as shown in FIG. 2, the power acquiring circuit 10 includes a channel interface 101 coupled to the first terminal and the second terminal of the sampling resistor 14, respectively; and a sampling path 102 coupled to the channel interface 101 and the microcontroller 11, to transfer the sampling signal of the sampling resistor 14 to the microcontroller 11.

In some embodiments, as shown in FIG. 2, the channel interface 101 includes: a first interface 1011 coupled to the first terminal of the sampling resistor 14 and configured to receive a first sampling signal; a second interface 1012 coupled to the second terminal of the sampling resistor 14 and configured to receive a second sampling signal; a multiplexer 1013 coupled to the first interface 1011 and the second interface 1012, and configured to transfer the first sampling signal or the second sampling signal to the sampling path 102 based on a selection from the power detection instruction. One of the first sampling signal and the second sampling signal is a voltage at the first terminal of the sampling resistor 14 proximal to the system power supply, and the other of the first sampling signal and the second sampling signal is a voltage at the second terminal of the sampling resistor 14 proximal to the output circuit 12. The first sampling signal is acquired via the first interface 1011, and the second sampling signal is acquired via the second interface 1012. The multiplexer 1013 may select to transfer the first sampling signal acquired by the first interface 1011 or the second sampling signal acquired by the second interface 1012 to the microcontroller 11, based on the power detection instruction.

Further optionally, the power acquiring circuit 10 further includes a channel selector 103 coupled to the multiplexer 1013 and the microcontroller 11, and configured to generate a multiplex selection signal based on the power detection instruction, so as to control whether the first interface 1011 is coupled to the sampling path 102 or the second interface 102 is coupled to the sampling path 102.

In some embodiments, as shown in FIG. 2, the sampling path 102 includes: an amplifier 1021 coupled to the multiplexer 1013 and configured to amplify the received first and second sampling signals; a signal adjustment circuit 1022 coupled to the amplifier 1021 and configured to adjust and amplify the amplified first and second sampling signals to a desired level; an analog-to-digital conversion circuit 1023 coupled to the signal adjustment circuit 1022 and configured to convert the analog first and second sampling signals into digital signals, which is beneficial to the process by a digital microcontroller MCU.

In some embodiments, as shown in FIG. 2, the sampling path 102 further includes a protocol conversion circuit 1024. The protocol conversion circuit 1024 is coupled to the analog-to-digital conversion circuit 1023, the channel selector 103, and the microcontroller 11, and is used for performing protocol conversion on communication data between the analog-to-digital conversion circuit 1023 and the microcontroller 11 and communication data between the channel selector 103 and the microcontroller 11. For example, the protocol conversion circuit 1024 may include an I2C (Inter-Integrated Circuit) bus interface circuit, or a serial peripheral interface SPI (Serial Peripheral Interface) circuit, to realize communication between the microcontroller 11 and the power acquiring circuit 10.

The power acquiring circuit may be built by adopting discrete elements, and may also be designed by adopting an integrated chip.

In some embodiments, the microcontroller 11 is configured to: automatically generate a power detection instruction and send the power detection instruction to the power acquiring circuit 10; calculate a power value of the smart window based on the first sampling signal and the second sampling signal; compare the power value of the smart window with a preset power value; and determine whether the smart window has a fault based on the comparison result of the power value of the smart window and the preset power value. Accurate current detection may be implemented for the smart window by configuring the microcontroller 11 to perform the above-described functions. Whether the smart window has a fault or not may be determined by flexibly setting a preset power value (a power threshold) or a preset current value (a current threshold) and comparing the preset power value and current value with the actual power value and current value of different smart windows.

In some embodiments, as shown in FIG. 1, the smart window controller further includes a data memory 16 coupled to the microcontroller 11 for storing the first sampling signal, the second sampling signal, the preset power value, the operating voltage of the smart window, the operating current of the smart window, and the power of the smart window. Therefore, the above data stored in the data memory 16 may be regarded as references for determining whether the system has a fault or not. The above data stored in the data memory 16 may be set in advance by a user, or may be acquired, calculated, updated and stored by the system automatically.

In the present disclosure, since the power acquiring circuit is adopted in the smart window controller to obtain the parameters, such as the current and the power of the smart window, the smart window controller may automatically determine the impedance of the smart window and automatically match the output power, thereby implementing fault analysis. When the output circuit is shorted, circuit protection can be automatically performed.

In addition, the smart window controller may further include other control circuit 17, other branch circuit 18 and a system ground 19. The other control circuit 17 is used for other control of the smart window controller other than power acquisition control, such as a clock control. The other branch circuit 18 includes a power conversion circuit or the like.

Figure 7:
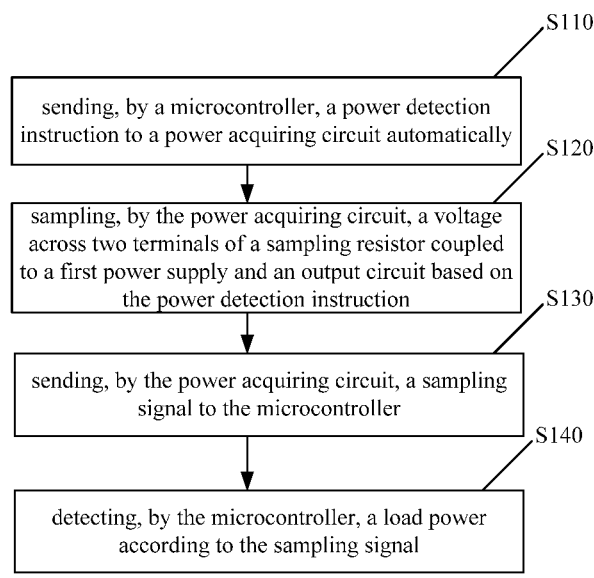
FIG. 7 is a flow chart illustrating a power detection method according to an embodiment of the present disclosure.
Figure 9:
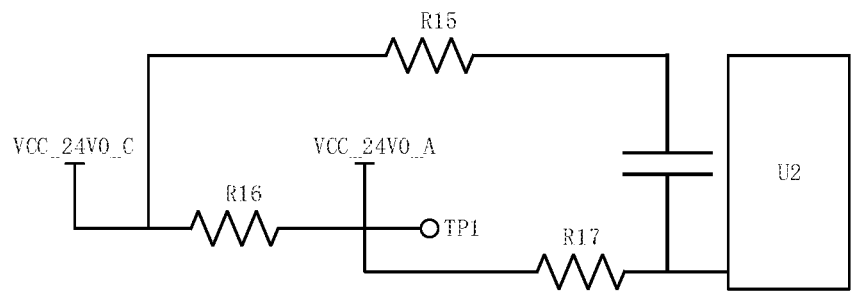
FIG. 9 is a schematic diagram illustrating a connection between a power acquiring circuit, a filter circuit, and a sampling resistor according to an embodiment of the present disclosure.

FIG. 9 is a schematic diagram illustrating a connection between the power acquiring circuit, the filter circuit, and the sampling resistor according to an embodiment of the present disclosure. The function of the power acquiring circuit may be implemented in a power detection ship. As shown in FIG. 7, a chip U2 may implement the above function of the power acquiring circuit; a capacitor C11, a resistor R15 and a resistor R17 form the RC filter circuit 15; and a resistor R16 serves as the sampling resistor 14. The sampling resistor R16 is coupled to the smart window circuit through a port TP1. The chip U2 may obtain the current, the voltage and the power of the smart window circuit and the whole system by detecting the voltage across a port VCC_24V0_C and a port TP1 of the sampling resistor R16.

According to one aspect of the present disclosure, a smart window is also provided, which includes the above smart window controller and a load circuit.

Figure 3:
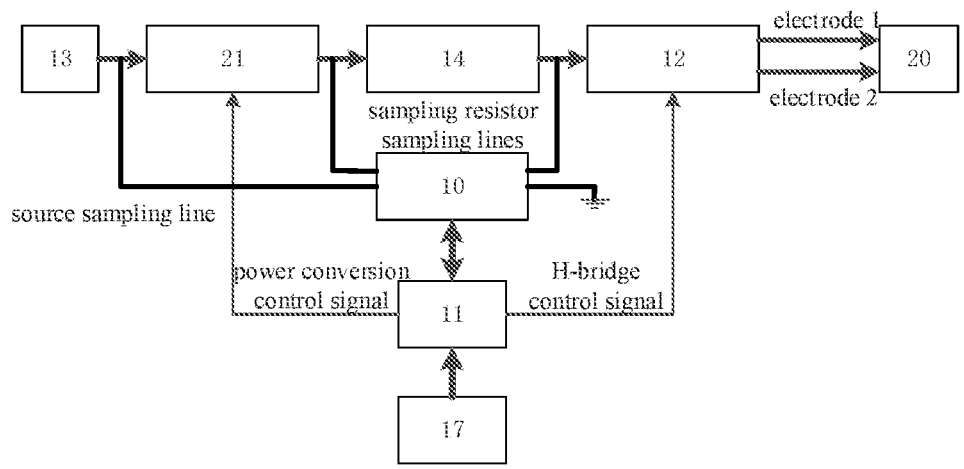
FIG. 3 is a schematic circuit diagram of a smart window according to an embodiment of the present disclosure.

FIG. 3 is a schematic circuit diagram of a smart window according to an embodiment of the present disclosure. As shown in FIG. 3, in addition to the circuits shown in FIG. 1 and FIG. 2, the smart window circuit further includes a voltage conversion circuit 21, which converts the system power voltage of 27V into an output voltage of 0-24V under a control of a power conversion control signal output by the microcontroller 11. The smart window circuit further includes an H-bridge output circuit 12, which outputs two paths of electrode signals to the smart window 20 through an electrode 1 and an electrode 2 under a control of an H-bridge control signal output by the microcontroller 11, so as to control the liquid crystal molecules in the smart window. The power acquiring circuit 10 is coupled to the two terminals of the sampling resistor 14 through sampling resistor sampling lines to sample the voltage across the two terminals of the sampling resistor. The power acquiring circuit 10 is further coupled to an output terminal of the first power supply 13 through a source sampling line, and is coupled to the ground, so as to obtain a total current and a total power of the system, and to further obtain a total power consumption of the system. The microcontroller 11 calculates the above parameters based on the voltage across the two terminals of the sampling resistor 14 and the voltage of the system power supply, and determines whether the circuit of the smart window has a fault or not.

Figure 4:
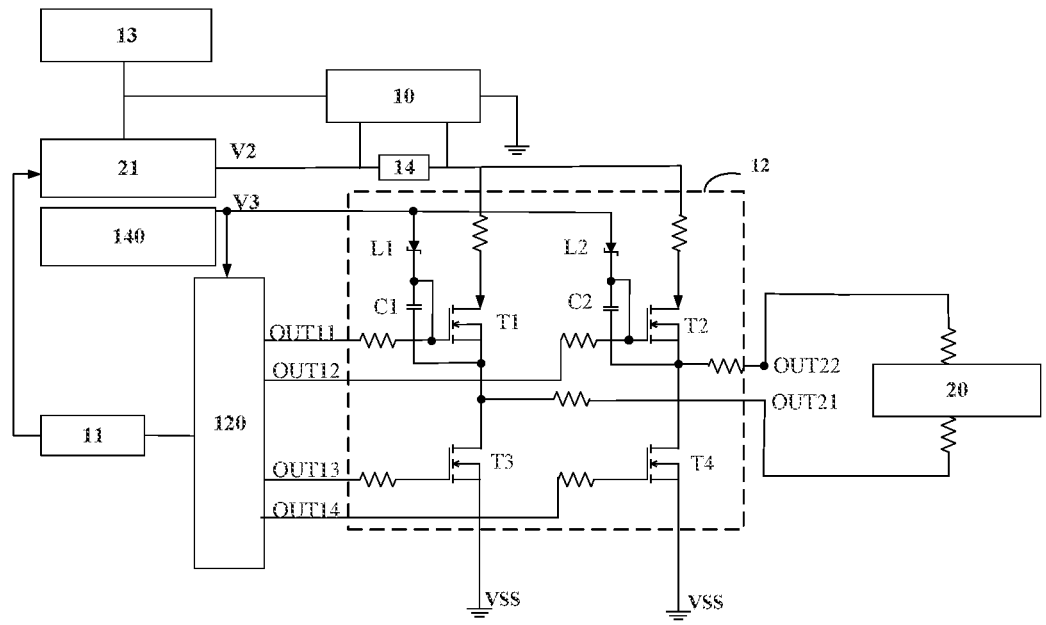
FIG. 4 is a circuit diagram of an implementation of a smart window according to an embodiment of the present disclosure.

FIG. 4 is a circuit diagram of a specific example of a smart window according to an embodiment of the present disclosure. For example, as shown in FIG. 4, the specific example circuit further includes a driving sub-circuit 120 and a second power supply 140. An voltage input terminal (not shown) of the driving sub-circuit 120 is coupled to an output terminal (not shown) of the microcontroller 11 to receive a driving control signal S2; and a power input terminal (not shown) of the driving sub-circuit 120 is coupled to the second power supply 140, and configured to amplify the driving control signal and output the amplified driving control signal at a voltage output terminal (not shown) of the driving sub-circuit 120. For example, since the microcontroller 11 has limited driving capability, the driving control signal S2 output at an output terminal of the microcontroller 11 is not enough to drive the driving output circuit 12, so that the driving control signal output by the microcontroller 11 may be, for example, amplified by the driving sub-circuit 120, and the amplified output voltage by the driving sub-circuit 120 may drive the output circuit 12 to operate normally.

It should be noted that the driving sub-circuit may be implemented in a common circuit in the related art, for example, the driving sub-circuit may be implemented as two H-bridge circuits, which will be not repeated herein.

For example, in order to enable the driving sub-circuit to output a lower voltage (e.g., a voltage below 5V), a single power supply, such as the second power supply 140, may be adopted to supply power for the driving sub-circuit 120. For example, the voltage provided by the second power supply 140 is lower than the voltage provided by the first power supply 13, so that the driving sub-circuit 120 may output a lower voltage under the driving of the second power supply 140.

In the example, voltage output terminals of the driving sub-circuit 120 include a first output terminal OUT11, a second output terminal OUT12, a third output terminal OUT13, and a fourth output terminal OUT14. Voltage output terminals of the output circuit 12 include a first voltage output terminal OUT21 and a second voltage output terminal OUT 22. For example, the first voltage output terminal OUT21 of the output circuit 12 is coupled to a first driving electrode of the smart window 20, and the second voltage output terminal OUT22 of the output circuit 12 is coupled to a second driving electrode of the smart window 20, which is not limited in the embodiments of the present disclosure.

As shown in FIG. 4, in some examples, an H-bridge output circuit 12 includes first to fourth transistors T1 to T4. It should be noted that, in the following description, an N-type transistor is taken as an example, which is not limited in the embodiments of the present disclosure.

For example, a gate of the first transistor T1 is coupled to the first output terminal OUT11 of the driving sub-circuit 120 to receive the amplified driving control signal, a first electrode of the first transistor T1 is coupled to an voltage output terminal (not shown) of the voltage conversion circuit 21 to receive a second voltage signal V2, and a second electrode of the first transistor T1 is coupled to the first voltage output terminal OUT21, so that when the first transistor T1 is turned on in response to the amplified driving control signal output from the first output terminal OUT11 of the driving sub-circuit 120, the first voltage output terminal OUT21 is coupled to the voltage output terminal (not shown) of the voltage conversion circuit 21 to output the second voltage signal V2 at the first voltage output terminal OUT 21. A gate of the second transistor T2 is coupled to the second output terminal OUT12 of the driving sub-circuit 120 to receive the amplified driving control signal, a first electrode of the second transistor T2 is coupled to the voltage output terminal (not shown) of the voltage conversion circuit 21 to receive the second voltage signal V2, and a second electrode of the second transistor T2 is coupled to the second voltage output terminal OUT22, so that when the second transistor T2 is turned on in response to the amplified driving control signal output from the second output terminal OUT12, the second voltage output terminal OUT22 is coupled to the voltage output terminal (not shown) of the voltage conversion circuit 21 to output the second voltage signal V2 at the second voltage output terminal OUT22. For example, a gate of the third transistor T3 is coupled to the third output terminal OUT13 of the driving sub-circuit 120 to receive the amplified driving control signal, a first electrode of the third transistor T3 is coupled to the first voltage terminal VSS (e.g., a ground terminal for providing a low level direct current signal) to receive a third voltage signal (e.g., a low level direct current signal, e.g., 0V, which is lower than a first voltage signal applied to the voltage conversion circuit 21 by the driving power supply 13), and a second electrode of the third transistor T3 is coupled to the first voltage output terminal OUT21, so that when the third transistor T3 is turned on in response to the amplified driving control signal output from the third output terminal OUT 13, the first voltage output terminal OUT21 is coupled to the first voltage terminal. For example, a gate of the fourth transistor T4 is coupled to the fourth output terminal OUT14 of the driving sub-circuit 120 to receive the amplified driving control signal, a first electrode of the fourth transistor T4 is coupled to the first voltage terminal VSS to receive the third voltage signal, and a second electrode of the fourth transistor T4 is coupled to the second voltage output terminal OUT22, so that when the fourth transistor T4 is turned on in response to the amplified driving control signal output from the fourth output terminal OUT14, the second voltage output terminal OUT22 is coupled to the first voltage terminal. For clarity and simplicity, the connection line between the first voltage terminals VSS is omitted. When the driving signal output from the microcontroller 10 is enough to meet the driving requirement, the microcontroller 10 may be directly coupled to the gates of the first to fourth transistors.

To enhance the reliability and stability of the circuit, in some embodiments of the present disclosure, the output circuit 12 may further include a bootstrap circuit (not shown in the drawings). For example, a voltage input terminal of the bootstrap circuit is coupled to the voltage output terminal of the output circuit 12 to receive the output voltage signal, and is configured to control the voltage at the voltage input terminal of the output circuit 12 based on the output voltage signal. That is, when the voltage at the second electrode of the first transistor T1 or the second transistor T2 is equal to the voltage at the first electrode (when the transistors are turned on, the voltage at the second electrode is equal to the voltage at the first electrode), the voltage at the gate of the first transistor T1 or the second transistor T2 will be bootstrapped by the voltage at the second electrode of the first transistor T1 or the second transistor 12 (i.e., the voltage difference Vgs between the voltage at the gate of the first transistor T1 or the second transistor T2 and the voltage at the second electrode of the first transistor T1 or the second transistor T2 is maintained unchanged), so that the voltage at the gate of the first transistor T1 or the second transistor T2 is higher than the voltage at the first electrode of the first transistor T1 or the second transistor T2, and the phenomenon that the first transistor T1 and the second transistor T2 are turned off at a stage that the transistors should be turned on, will not occur, thereby enhancing the reliability and stability of the circuit.

For example, as shown in FIG. 4, the bootstrap circuit may be implemented to include a first capacitor C1, a first diode L1, a second capacitor C2, and a second diode L2. For example, the first capacitor C1 and the first diode L1 are used for the bootstrap of the first transistor T1, and the second capacitor C2 and the second diode L2 are used for the bootstrap of the second transistor 12.

For example, a first terminal of the first capacitor C1 is coupled to the second electrode of the first transistor T1, and a second terminal of the first capacitor C1 is coupled to the gate of the first transistor T1. A first electrode of the first diode L1 is coupled to the second power supply 140, and a second electrode of the first diode L1 is coupled to the gate of the first transistor T1. A first terminal of the second capacitor C2 is coupled to the second electrode of the second transistor T2, and a second terminal of the second capacitor C2 is coupled to the gate of the second transistor T2. A first electrode of the second diode L2 is coupled to the second power supply 140, and a second electrode of the second diode L2 is coupled to the gate of the second transistor T2.

Figure 5:
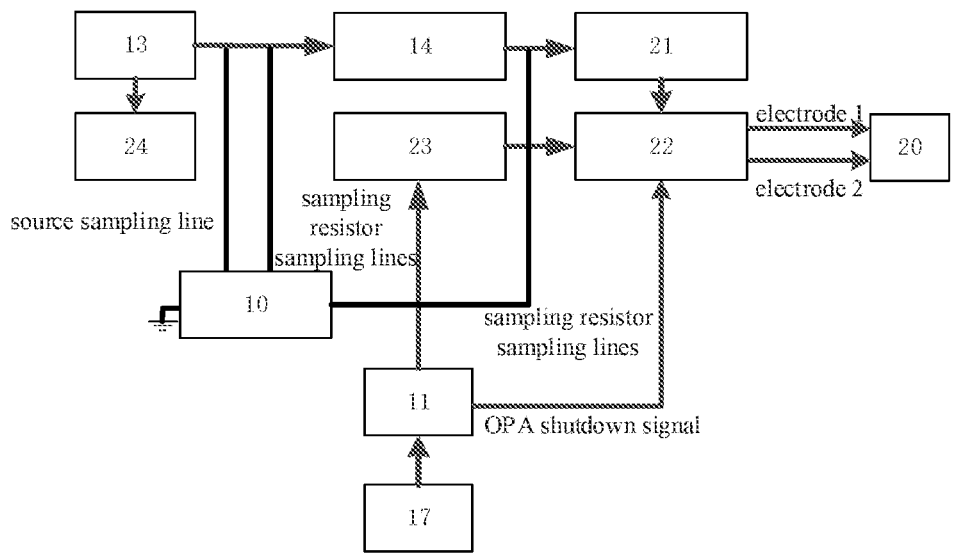
FIG. 5 is a schematic circuit diagram of a smart window according to an embodiment of the present disclosure.

As shown in FIG. 4, the sampling resistor 14 is coupled in series between the output circuit 12 and the voltage conversion circuit 21; and the power acquiring circuit 10 is coupled to the two terminals of the sampling resistor 14 respectively to obtain the voltage across the two terminals of the sampling resistor 14, thereby obtaining the current, the voltage and the power of the smart window. In addition, the power acquiring circuit 10 further obtains the current output by the system power supply 13 to obtain the total current and the total power of the system. FIG. 5 is a schematic circuit diagram of a smart window according to an embodiment of the disclosure. As shown in FIG. 5, in addition to the circuits shown in FIGS. 1 and 2, the smart window circuit further includes a voltage conversion circuit 21, a DAC/DDS circuit 23, an OPA circuit 22, and a control system voltage domain circuit 24. The voltage conversion circuit 21 converts the system power supply voltage into a positive voltage 24V and a negative voltage 24V required by the OPA (operational amplifier) circuit 22. The DAC/DDS (digital to analog converter/signal generator) circuit sends a control signal to the OPA circuit 22 under the control of the microcontroller 11, which in turn outputs an electrode signal to the smart window circuit 20. The power acquiring circuit 10 is further coupled to the output terminal of the system power supply 13 through a source sampling line, and is coupled to the ground, so as to obtain the total current and the total power of the system and further to obtain the total power consumption of the system. The microcontroller 11 calculates the above parameters based on the voltage across the terminals of the sampling resistor 14 and the voltage of the system power supply, and determines whether the smart window circuit has a fault or not. The control system voltage domain circuit 24 is used to control the power supply voltages required by various components of the smart window controller.

Figure 6:
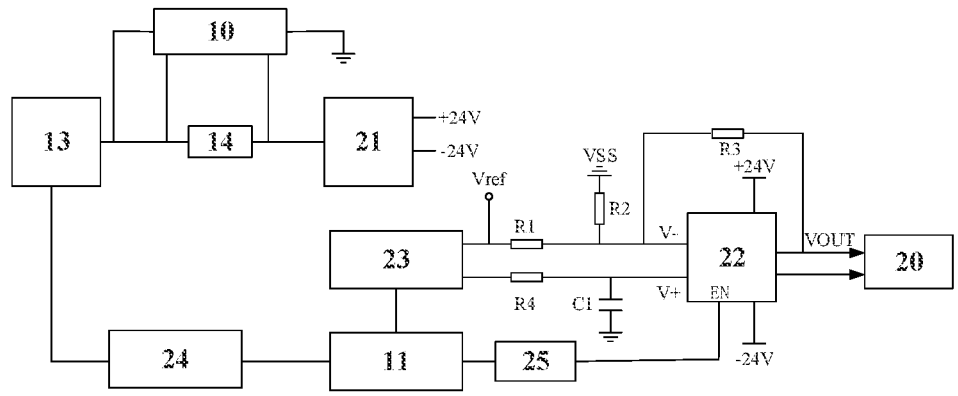
FIG. 6 is a circuit diagram of an implementation of a smart window according to an embodiment of the present disclosure.

FIG. 6 is a circuit diagram of a specific example of a smart window according to an embodiment of the present invention. As shown in FIG. 6, the circuit of the specific example of the smart window includes not only the above structure, but also a first resistor R1, a second resistor R2, a third resistor R3, a fourth resistor R4, and a first capacitor C1. An input terminal of the DAC/DDS circuit 23 is coupled to the microcontroller 11, a first output terminal of the DAC/DDS circuit 23 is coupled to a reference voltage terminal Vref and a first terminal of the first resistor R1, and a second output terminal of the DAC/DDS circuit 23 is coupled to a first terminal of the fourth resistor R4. A second terminal of the first resistor R1 is coupled to a first terminal of the second resistor R2, and a second terminal of the second resistor R2 is coupled to a low power supply voltage terminal VSS. A first terminal of the third resistor R3 is coupled to a second terminal of the first resistor R1, a first terminal of the second resistor R2 is coupled to an inverting input terminal of the OPA circuit 22, and a forward input terminal of the OPA circuit 22 is coupled to a second terminal of the fourth resistor R4 and a first terminal of the first capacitor C1. A second terminal of the first capacitor C1 is coupled to the low power supply voltage terminal VSS, an output terminal of the OPA circuit 22 is coupled to the smart window, and a power supply terminal of the OPA circuit 22 is coupled to the voltage conversion circuit 21. Of course, a control system voltage domain circuit 24 is also provided in the smart window controller to supply power for the microcontroller 11. In the following description of the specific operation, the power supply including the first power supply 13 as the system power supply and the voltage conversion circuit 21 are taken as an example. The voltage conversion circuit 21 is used for converting the 27V voltage input from the first power supply 13 into a voltage 24V and a voltage −24V.

As shown in FIG. 6, the reference voltage terminal Vref, the first resistor R1, the second resistor R2, the third resistor R3, and the output voltage terminal VOUT of the OPA circuit 22 constitute an operational amplifier feedback system, and this design needs to output a sinusoidal signal with voltages of ±24V. According to the virtual short concept of the operational amplifier, at the inverting input terminal of the OPA circuit 22, the following formula 1 is obtained according to the current relationship:

$$(Vref-V-)/R1+(VOUT-V-)/R3=V-/R2; \quad \text{formula (1)}.$$

And then according to the virtual short concept of the operational amplifier, there is V−=V+=Vdac; formula (2).

By combining the formula (1) and the formula (2), the relationship, between the output voltage and the voltage Vdac at the inverting input terminal of the OPA circuit 22 in a case of a direct current output from the DAC/DDS 23, is obtained as follows:

$$VOUT=[(1/R1+1/R2+1/R3)\times Vdac-Vref/R1]\times R3; \quad \text{formula (3)}.$$

Here, assuming that Vref=2.5V, and the voltage Vdac is in a range of 0-2.5V, in order to obtain the output voltages ±24V, when Vdac=2.5V=Vref, a maximum output voltage is required for the ORA circuit 22, which is expressed as:

$$VOUT=(R3/R2+1)\times Vref; \quad \text{formula (4)}.$$

Here, VOUT=23.9V was obtained by substituting 240K for R3, 28K for R2, and 2.5V for Vref in formula (4).

When Vdac=0V, the high-voltage operational amplifier 29 is required to output a minimum output, which is expressed as:

$$VOUT=-(R3/R1)\times Vref; \quad \text{formula (5)}.$$

Here, 25K Ω of R1 is substituted into the formula (5) to obtain VOUT=−24V.

In conclusion, the amplitude of the ±24V may be output from the OPA circuit 22 according to the above parameter setting. In addition, when a waveform output by the DAC/DDC 3 represents a frequency signal, as shown in FIG. 6, the fourth resistor R4, the first capacitor C1 and the operational amplifier constitute an active low-pass filter circuit. A frequency of the active low-pass filter circuit is calculated by applying a laplace transform to the voltage at the non-inverting input terminal V+ of the high-voltage operational amplifier as follows:

$$V+(s)=[1/(1+sR4C1)]\times Vdac(s); \quad \text{formula (6)}.$$

An output according to the formulas (1), (2), and (6) can be obtained:

$$VOUT(s)=\{(1/R1+1/R2+1/R3)\times[1.4+sR4C1)]\times Vdac(s)-Vref/R1\}\times R3; \quad \text{formula (7)}.$$

Taking A=(1/R1+1/R2+1/R3)×R3, B=(R3/R1)×Vref, τ=1/R4C1, the formula (7) can be simplified as:

$$VOUT(s)=A\times\{1/[1+(s/\tau)]\}\times Vdac(s)-B; \quad \text{formula (8)}.$$

According to the formula (8), an amplitude-frequency characteristics curve of the input signal and the output signal can be obtained, so as to achieve the optimal amplification effect of the output frequency signal. According to the system requirements, f may be taken as 200 Hz. s=j2πf is substituted into the formula (8), so that the value of the first capacitor C1 can be determined according to the value of the fourth resistor R4.

In FIG. 6, the microcontroller 11 is used fir reading data in a waveform data control circuit according to an external control command, and then outputting the read data to the DAC/DDS circuit 23 for conversion. The data from the DAC/DDS circuit 23 is input to the OPA circuit 22, and then a required power waveform signal may be obtained from the OPA circuit 22. In addition, the microcontroller 11 may also be coupled to the OPA circuit 22 through a shutdown circuit 25, and send an OPA shutdown signal to the shutdown circuit 25, thereby shutting down the OPA circuit 22 by controlling an enable terminal EN of the OPA circuit 22. The shutdown circuit 25 may be an optical coupler circuit, which outputs a corresponding shutdown voltage to shut down the OPA circuit 22 under a control of the OPA shutdown signal sent by the microcontroller 11.

As shown in FIG. 6, the sampling resistor 14 is coupled in series between the first power supply 13 and the voltage conversion circuit 21, and the power acquiring circuit 10 is coupled to the two terminals of the sampling resistor 14 respectively to obtain the voltage across the two terminals of the sampling resistor 14, thereby obtaining the current, the voltage and the power of the smart window. In addition, the power acquiring circuit 10 further obtains the current output by the system power supply 13 to obtain the total current and the total power of the system.

According to one aspect of the disclosure, a method for detecting power of a smart window circuit by using the above smart window controller is also provided. FIG. 7 is a flow chart illustrating a power detection method according to an embodiment of the present disclosure, which includes the following steps.

At S110, the microcontroller automatically sends a power detection instruction to the power acquiring circuit. The microcontroller may automatically send the power detection instruction to the power acquiring circuit based on a fixed cycle, so as to automatically detect the power of the smart window.

At S120, the power acquiring circuit samples the voltage across the two terminals of the sampling resistor which is coupled to the system power supply and the output circuit according to the power detection instruction. The sampling of the voltage across the two terminals of the sampling resistor further includes: sampling the voltage at the terminal of the sampling resistor coupled to the system power supply to obtain the first sampling signal; and sampling the voltage at the terminal of the sampling resistor coupled to the output circuit to obtain the second sampling signal.

At S130, the power acquiring circuit sends the sampling signal to the microcontroller.

At S140, the microcontroller detects the power of the smart window according to the sampling signal. The power detection for the smart window by the microcontroller according to the sampling signal, further includes: calculating the power value of the smart window according to the first sampling signal and the second sampling signal, comparing the power value of the smart window with the preset power value; and determining whether the smart window has a fault or not according to the comparison result of the power value of the smart window and the preset power value. If the power value of the smart window is not in the range of the corresponding preset power value, it is determined that the smart window has a fault, the output current and the voltage are cut off and an alarm is raised.

Figure 8:
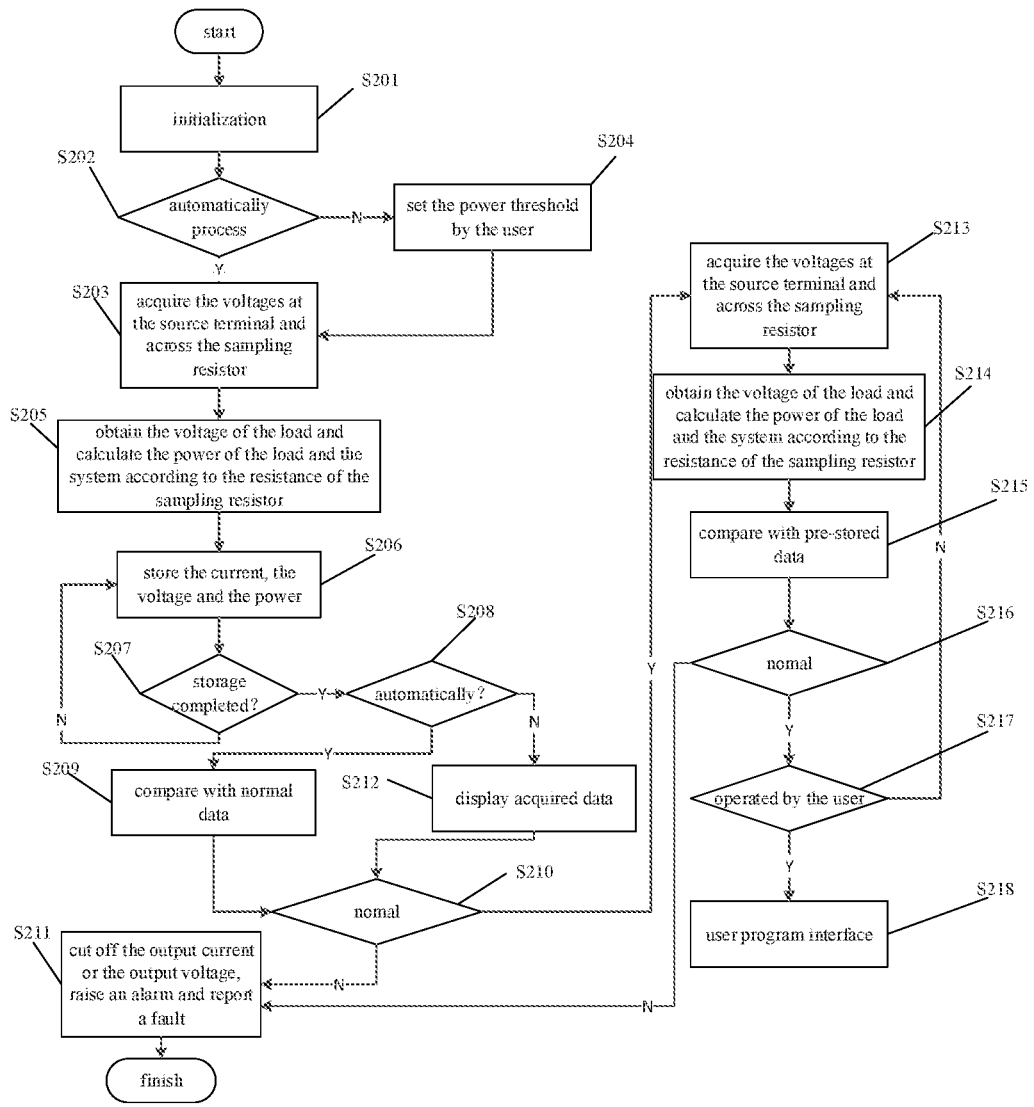
FIG. 8 is a flow chart illustrating an operation procedure of a smart window controller according to an embodiment of the present disclosure.

FIG. 8 is a flow chart illustrating operation of a smart window controller according to an embodiment of the present disclosure. After the start of operation, at S201, each component of the smart window controller is initialized. At S202, whether the system automatically processes or not is determined. If the system automatically processes, at S203, the voltages at the source terminal and across the sampling resistor are acquired so as to determine the power threshold of the smart window; or if the system does not process automatically, at S204, the power threshold of the smart window is set by the user, and then it proceeds to S203. At S205, the voltage, the current and the power of the smart window and the system are obtained according to the resistance of the sampling resistor. The current of the smart window may be calculated according to the voltage across the sampling resistor and the resistance of the sampling resistor, and then the power of the smart window may be calculated according to the resistance of the smart window. The power of the system may be calculated according to the voltage and current of the system. At S205, the calculated current, the calculated voltage and the calculated power of the smart window are stored, and the storage is performed at S207. After the storage is completed, at S208, whether the comparison is automatically performed or not is displayed. If the comparison is automatically performed, at S209, the calculated actual current, the calculated actual voltage and the calculated actual power of the smart window are compared with the pre-stored current, the pre-stored voltage and the pre-stored power of the smart window. When the smart window operates normally, the voltage, the current and the power of the smart window may be automatically obtained in advance and are used as a comparison reference, or the power threshold set by the user at S204 or the like may be used as a comparison reference. And then at S210, whether the smart window is normally operated or not is determined. If the comparison is selected to be not automatically performed at S208, at S212, the acquired data is displayed, and whether the smart window is normally operated or not is determined by the user. If it is determined that the smart window is not normally operated at S210, the output current or the output voltage are cut off at S211, and an alarm is raised. Meanwhile, a fault is reported, and then the smart window stops operation. At S210, when it is determined that the smart window is normally operated, the following steps are repeated. For example, at S213, the voltages at the source terminal and across the sampling resistor are acquired to determine the power threshold of the smart window. At S214, the voltage and the power of the smart window and the system are obtained according to the resistance of the sampling resistor. At S215, the calculated actual current, the calculated actual voltage and the calculated actual power of the smart window are compared with the pre-stored current, the pre-stored voltage and the pre-stored power of the smart window. At S216, whether the smart window is normally operated or not is determined. If the smart window is not normally operated, the output current and the output voltage are cut off and an alarm is raised, while a fault is reported and then the smart window stops operating. If the smart window is normally operated, at S217, whether the smart window is operated by a user or not is determined. If the smart window is operated by a user, at S218, a user program interface is entered; and if the smart window is not operated by a user, it returns to S213.

When operating according to the flow chart shown in FIG. 8, the smart window controller may acquire the voltage across the sampling resistor in real time to obtain the real-time current, the real-time voltage and the real-time power of the smart window. Once a large current occurs due to the shorting of the output circuit, the output current is immediately cut off or the output voltage is reduced, and an alarm is raised, which is beneficial to protecting the output circuit. In addition, the smart window controller may: automatically acquire the current in normal operating state, adjust the threshold of the output current according to different smart windows, calculate the external impedance of the smart window, and store the impedance. The fault can be reported once the output current is mismatching with the threshold of the output current, especially in a plurality of smart window controller integrated control places in a bullet train or a building application, thereby providing an effective way for convenience of maintenance and management.

According to one aspect of the present disclosure, a storage medium is further provided. A computer program is stored on the storage medium. The computer program, when executed by a processor, may implement the function of the power detection of the smart window by the smart window controller as described above.

It should be understood that the above embodiments are merely exemplary embodiments employed to illustrate the principles of the present disclosure, and the present disclosure is not limited thereto. It will be apparent to one of ordinary skill in the art that various changes and modifications can be made therein without departing from the spirit and scope of the disclosure, and these changes and modifications are to be considered within the scope of the disclosure.

What is claimed is:

1. A smart window controller, comprising:
a microcontroller;
an output circuit coupled to the microcontroller and configured to output a driving signal under a control of the microcontroller;
a first power supply coupled to a load through the output circuit and configured to supply an operating power supply to the load;
a sampling resistor between the output circuit and the first power supply, a first terminal of the sampling resistor being coupled to the first power supply, and the second terminal of the sampling resistor being coupled to the output circuit; and
a power acquiring circuit coupled to the microcontroller and respectively coupled to the first terminal and the second terminal of the sampling resistor, so as to acquire a voltage across the first terminal and the second terminal of the sampling resistor and send the voltage to the microcontroller based on a power detection instruction sent by the microcontroller, and further to acquire a load current value and a load power value;
wherein the power acquiring circuit comprises:
a channel interface coupled to the first terminal and the second terminal of the sampling resistor, respectively; and
a sampling path coupled to the channel interface and the microcontroller to transfer a sampling signal of the sampling resistor to the microcontroller; and
wherein the channel interface comprises:
a first interface coupled to the first terminal of the sampling resistor and configured to receive a first sampling signal;
a second interface coupled to the second terminal of the sampling resistor and configured to receive a second sampling signal; and
a multiplexer coupled to the first interface and the second interface, and configured to select, based on the power detection instruction, one of the first sampling signal and the second sampling signal to be transferred to the sampling path.

2. The smart window controller of claim 1, wherein the power acquiring circuit further comprises a channel selector, and the channel selector is coupled to the multiplexer and the microcontroller, and is configured to generate a multiplex selection signal according to the power detection instruction to control one of the first interface and the second interface to be coupled to the sampling path.

3. The smart window controller of claim 2, wherein the sampling path comprises:
an amplifier coupled to the multiplexer and configured to amplify the received first sampling signal and the received second sampling signal;
a signal adjustment circuit coupled to the amplifier and configured to adjust the amplified first sampling signal and the amplified second sampling signal to a desired level; and
an analog-to-digital conversion circuit coupled to the signal adjustment circuit and configured to convert analog signals of the first sampling signal and the analog second sampling signals into digital signals.

4. The smart window controller of claim 3, wherein the sampling path further comprises a protocol conversion circuit coupled to the analog-to-digital conversion circuit, the channel selector, and the microcontroller, to perform a protocol conversion on communication data between the analog-to-digital conversion circuit and the microcontroller and communication data between the channel selector and the microcontroller.

5. The smart window controller of claim 4, further comprising a filter circuit coupled to the first terminal and the second terminal of the sampling resistor, the first interface and the second interface, respectively, to filter the first sampling signal and the second sampling signal and output the filtered first sampling signal and the filtered second sampling signal to the first interface and the second interface, respectively.

6. The smart window controller of claim 5, wherein the microcontroller is configured to:
generate the power detection instruction and send the power detection instruction to the power acquiring circuit automatically;
calculate the load power value according to the first sampling signal and the second sampling signal;
compare the load power value with a preset power value; and
determine whether a load circuit has a fault or not according to a comparison result between the load power value and the preset power value.

7. The smart window controller of claim 6, further comprising a data memory coupled to the microcontroller to store the first sampling signal, the second sampling signal, the preset power value, a load voltage value, the load current value, and the load power value.

8. The smart window controller of claim 1, wherein the output circuit is an H-bridge output circuit, and
the smart window controller further comprises a voltage conversion circuit coupled between the first power supply and the first terminal of the sampling resistor.

9. The smart window controller of claim 8, wherein the H-bridge output circuit comprises a first transistor, a second transistor, a third transistor, and a fourth transistor;
a gate of the first transistor is coupled to the microcontroller, a first electrode of the first transistor is coupled to the second terminal of the sampling resistor, and a second electrode of the first transistor is coupled to a first voltage output terminal;
a gate of the second transistor is coupled to the microcontroller, a first electrode of the second transistor is coupled to the second terminal of the sampling resistor, and a second electrode of the second transistor is coupled to a second voltage output terminal;
a gate of the third transistor is coupled to the microcontroller, a first electrode of the third transistor is coupled to the first voltage terminal, and a second electrode of the third transistor is coupled to the first voltage output terminal; and
a gate of the fourth transistor is coupled to the microcontroller, a first electrode of the fourth transistor is coupled to the first voltage terminal, and a second electrode of the fourth transistor is coupled to the second voltage output terminal.

10. The smart window controller of claim 1, wherein the output circuit comprises an operational amplifier circuit;
the smart window controller further comprises a voltage conversion circuit and a digital-to-analog conversion circuit or comprises a voltage conversion circuit and a signal generation circuit; and
the voltage conversion circuit is between the second terminal of the sampling resistor and the operational amplifier circuit, and the digital-to-analog conversion circuit or the signal generation circuit is between the output circuit and the microcontroller.

11. A smart window, comprising the smart window controller of claim 1 and a load circuit.

12. A method for detecting a power by the smart window controller of claim 1, comprising:
sending, by the microcontroller, the power detection instruction to the power acquiring circuit automatically;
sampling, by the power acquiring circuit, the voltage across the first terminal and the second terminal of the sampling resistor coupled to the first power supply and the output circuit according to the power detection instruction;
sending, by the power acquiring circuit, the sampling signal to the microcontroller; and
detecting, by the microcontroller, a load power according to the sampling signal.

13. The method of claim 12, wherein the sampling the voltage across the first terminal and the second terminal of the sampling resistor further comprises:
sampling a signal at the first terminal of the sampling resistor coupled to the first power supply to obtain a first sampling signal; and
sampling a signal at the second terminal of the sampling resistor coupled to the output circuit to obtain a second sampling signal.

14. The method of claim 13, wherein the detecting, by the microcontroller, the load power according to the sampling signal further comprises:
calculating a load power value according to the first sampling signal and the second sampling signal;
comparing the load power value to a preset power value; and
determining whether the load has a fault or not according to a comparison result between the load power value and the preset power value, and
in responsive to the load power value being not the preset power value, determining that the load has a fault, and cutting off an output current or an output voltage and raising an alarm.

15. A non-transitory computer-readable storage medium storing instructions which, when executed by a processor, cause the processor to perform the method of claim 12.

16. The smart window controller of claim 1, wherein the sampling path comprises:

an amplifier coupled to the multiplexer and configured to amplify the received first sampling signal and the received second sampling signal;

a signal adjustment circuit coupled to the amplifier and configured to adjust the amplified first sampling signal and the amplified second sampling signal to a desired level; and an analog-to-digital conversion circuit coupled to the signal adjustment circuit and configured to convert analog signals of the first sampling signal and the analog second sampling signals into digital signals.

17. The smart window controller of claim 1, further comprising a filter circuit coupled to the first terminal and the second terminal of the sampling resistor, the first interface and the second interface, respectively, to filter the first sampling signal and the second sampling signal and output the filtered first sampling signal and the filtered second sampling signal to the first interface and the second interface, respectively.

18. The smart window controller of claim 2, further comprising a filter circuit coupled to the first terminal and the second terminal of the sampling resistor, the first interface and the second interface, respectively, to filter the first sampling signal and the second sampling signal and output the filtered first sampling signal and the filtered second sampling signal to the first interface and the second interface, respectively.

* * * * *